United States Patent
Park et al.

(10) Patent No.: US 9,965,579 B2
(45) Date of Patent: May 8, 2018

(54) METHOD FOR DESIGNING AND MANUFACTURING AN INTEGRATED CIRCUIT, SYSTEM FOR CARRYING OUT THE METHOD, AND SYSTEM FOR VERIFYING AN INTEGRATED CIRCUIT

(71) Applicant: Samsung Electronics Co., Ltd., Suwon-si (KR)

(72) Inventors: Chul-Hong Park, Seongnam-si (KR); Sang-Hoon Baek, Seoul (KR); Su-Hyeon Kim, Bucheon (KR); Kyoung-Yun Baek, Suwon (KR); Sung-Wook Ahn, Seoul (KR); Sang-Kyu Oh, Gwacheon-si (KR); Seung-Jae Jung, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 133 days.

(21) Appl. No.: 14/690,227

(22) Filed: Apr. 17, 2015

(65) Prior Publication Data
US 2015/0302135 A1 Oct. 22, 2015

Related U.S. Application Data

(60) Provisional application No. 61/980,690, filed on Apr. 17, 2014.

(30) Foreign Application Priority Data

Aug. 6, 2014 (KR) .................. 10-2014-0101215

(51) Int. Cl.
*G06F 9/455* (2006.01)
*G06F 17/50* (2006.01)

(52) U.S. Cl.
CPC ...... *G06F 17/5081* (2013.01); *G06F 17/5072* (2013.01)

(58) Field of Classification Search
USPC ........................................ 716/112
See application file for complete search history.

(56) References Cited

U.S. PATENT DOCUMENTS

| 9,405,879 B2 * | 8/2016 | Wang ............... G06F 17/5081 |
| 2008/0066047 A1 * | 3/2008 | Heng ............... G06F 17/5068 716/52 |
| 2011/0035717 A1 * | 2/2011 | Lu ................... G06F 17/5068 716/134 |
| 2012/0297352 A1 * | 11/2012 | Filippi ............. G06F 17/5081 716/112 |

* cited by examiner

*Primary Examiner* — Bryce Aisaka
(74) *Attorney, Agent, or Firm* — Muir Patent Law, PLLC

(57) ABSTRACT

A method of manufacturing an integrated circuit, a system for carrying out the method, and a system for verifying an integrated circuit may use a standard cell layout including a first layout region that may violate design rules. The method for designing an integrated circuit may comprise receiving a data file that includes a scaling enhanced circuit layout, and designing a first standard cell layout using design rules and the data file. The designing the first standard cell layout may include designing a first layout region of the first standard cell layout using the data file, and designing a second region of the first standard cell layout using the design rules.

20 Claims, 14 Drawing Sheets

METHOD FOR DESIGNING AND MANUFACTURING AN INTEGRATED CIRCUIT, SYSTEM FOR CARRYING OUT THE METHOD, AND SYSTEM FOR VERIFYING AN INTEGRATED CIRCUIT

CROSS-REFERENCE TO RELATED APPLICATIONS

This application claims priority from Korean Patent Application No. 10-2014-0101215, filed on Aug. 6, 2014 in the Korean Intellectual Property Office, and all the benefits accruing therefrom under 35 U.S.C. 119, and also claims priority from U.S. Provisional Patent Application No. 61/980,690, filed on Apr. 17, 2014, and all the benefits accruing therefrom under 35 U.S.C. 119, the contents of each of which are herein incorporated by reference in their entirety.

BACKGROUND

1. Field of the Invention

The present invention relates to a method for designing and manufacturing an integrated circuit, a system for carrying out the method, and a system for verifying an integrated circuit.

2. Description of the Prior Art

An integrated circuit (IC) is manufactured by patterning devices and interconnections thereof on a substrate, such as a semiconductor wafer. As a start of a process for manufacturing an integrated circuit, a designer designs the integrated circuit using electronic design automation (EDA) for positioning and connecting various constituent elements of the circuit so that the constituent elements act in response to each other. An integrated circuit layout design is generated using the electronic design automation. The integrated circuit layout design includes circuit constituent elements, connection wirings, as well as physical positions and sizes of various patterns of the layers forming the integrated circuit.

By implementing the integrated circuit layout design (e.g. by processing a semiconductor substrate and layers added thereon), the integrated circuit is manufactured. However, before the integrated circuit is manufactured using the integrated circuit layout design as described above, the integrated circuit layout design may pass through a verification process.

The layout verification process is performed by checking whether the integrated circuit layout design satisfies one or more design rules. However, once the integrated circuit layout that satisfies the one or more design rules is generated, scaling of the integrated circuit, such as reducing a size of one or more portions of the integrate circuit, is difficult.

SUMMARY

According to some embodiments, there is provided a method for designing an integrated circuit, comprising receiving a data file that includes a scaling enhanced circuit layout, and designing a first standard cell layout using design rules and the data file. The designing the first standard cell layout includes designing a first region of the first standard cell layout using the data file, and designing a second region of the first standard cell layout using design rules.

The method may further comprise checking the design rule of the first standard cell layout using a design rule checker. The checking the design rule of the first standard cell layout may include skipping the checking of the first region of the first standard cell layout.

In one embodiment, the scaling enhanced circuit layout includes a marker layer.

In one embodiment, the designing the first region of the first standard cell layout includes arranging the scaling enhanced circuit layout in the first region of the first standard cell layout.

The method may further comprise designing a second standard cell layout that is different from the first standard cell layout.

In one embodiment, the designing the second standard cell layout includes designing a first region of the second standard cell layout using the data file, and designing a second region of the second standard cell layout using the design rule.

In one embodiment, the first region of the first standard cell layout and the first region of the second standard cell layout comprise the same layout.

The method may further comprise designing a logic block layout that includes the first standard cell layout. The first standard cell layout includes the scaling enhanced circuit layout, and the scaling enhanced circuit layout is arranged in a partial region of the logic block layout.

The method may further comprise defining a design rule violation requisite region in a part of a standard cell, designing the design rule violation layer through optimization of a process of manufacturing the design rule violation requisite region, designing the scaling enhanced circuit layout that includes the design rule violation layer, and designating the scaling enhanced circuit layout as a golden scaling enhanced layout.

The method may further comprise checking whether the scaling enhanced circuit layout included in the logic block layout is changed in a process of designing the first standard cell layout using the golden scaling enhanced layout.

The method may further comprise making the data file through storing of the scaling enhanced circuit layout.

In one embodiment, the second region of the first standard cell layout is positioned in the vicinity of the first region of the first standard cell layout.

In one embodiment, the scaling enhanced circuit layout is a part of a standard cell layout that performs a specific function.

In one embodiment, the data file is one of a GDS (Graphic Database System) file, a GDS instance file, and a hard macro file.

In other aspects, there is provided a method for designing an integrated circuit, comprising designing a standard cell layout that includes a first scaling enhanced circuit layout, designing a logic block layout that includes the standard cell layout, and updating the logic block layout through replacement of the first scaling enhanced circuit layout in the logic block layout by a second scaling enhanced circuit layout.

In one embodiment, the standard cell layout includes a first region and a second region that is positioned in the vicinity of the first region, and the designing the standard cell layout includes arranging the first scaling enhanced circuit layout in the first region of the standard cell layout, and designing the second region of the standard cell layout using a design rule.

In one embodiment, the first scaling enhanced circuit layout is provided in the form of a GDS (Graphic Database System) file, a GDS instance file, or a hard macro file.

In one embodiment, the updating the logic block layout includes removing the first scaling enhanced circuit layout included in the logic block layout, and arranging the second scaling enhanced circuit layout in a position from which the first scaling enhanced circuit layout is removed.

In one embodiment, the first scaling enhanced circuit layout includes a marker layer, and the updating the logic block layout includes confirming a position of the first scaling enhanced circuit layout using the marker layer.

In still other aspects, there is provided a method for designing an integrated circuit, receiving a first data file that includes a first scaling enhanced circuit layout and a second data file that includes a second scaling enhanced circuit layout, designing a first standard cell layout using a design rule and the first data file, designing a second standard cell layout using the design rule and the second data file, and designing a logic block layout that includes the first standard cell layout and the second standard cell layout. The first scaling enhanced circuit layout includes a first design rule violation layer, and the second scaling enhanced circuit layout includes a second design rule violation layer. The designing the first standard cell layout may include designing a first region of the first standard cell layout using the first data file, and designing a second region of the first standard cell layout using the design rule. And, the second standard cell layout may include designing a first region of the second standard cell layout using the second data file, and designing a second region of the second standard cell layout using the second data file.

In one embodiment, the first standard cell layout and the second standard cell layout are layouts of a standard cell that perform different functions.

In one embodiment, the first scaling enhanced circuit layout and the second scaling enhanced circuit layout are the same layout.

In one embodiment, the first standard cell layout and the second standard cell layout perform the same function.

In one embodiment, the first region of the first standard cell layout and the first region of the second standard cell layout are positioned in different regions of the standard cell layout.

In still another aspect, there is provided a system for verifying an integrated circuit, comprising an input module receiving an input of a logic block layout that includes a scaling enhanced circuit layout, and a verification module determining whether the scaling enhanced circuit layout is changed during designing through comparison of the scaling enhanced circuit layout with a golden scaling enhanced layout that is the original of the scaling enhanced circuit layout.

In still another aspect, there is provided a system for designing an integrated circuit, comprising a storage module storing a logic block layout that includes a first scaling enhanced circuit layout, an input module receiving an input of a second scaling enhanced circuit layout that is obtained by updating the first scaling enhanced circuit layout, and an update module removing the first scaling enhanced circuit layout from the logic block layout, and arranging the second scaling enhanced circuit layout in a position from which the first scaling enhanced circuit layout is removed.

Other aspects provide method of manufacturing an integrated circuit, comprising creating a layout of the integrated circuit using a netlist and a standard cell library, the netlist comprising a plurality of instances, their functions and interconnections between the instances, the standard cell library including a first standard cell layout including a first layout portion and a second layout portion, the first layout portion including design elements that violate at least one of a plurality of design rules, the second layout portion being variable and restricted to conforming to the plurality of design rules; creating a plurality of photolithographic masks using the layout of the integrated circuit; and creating the integrated circuit layout by patterning layers formed on a substrate using the plurality of photolithographic masks.

The first layout portion of the first standard cell layout may comprise a plurality of layers of the first standard cell. The first standard cell layout may comprise a first definition of the first layout portion that is fixed and comprises a second definition of the second layout portion that is variable.

The first definition may define the size of the first layout portion as fixed and the second definition may define the second layout portion as variable.

The first definition may define the positions of elements comprising of the first layout portion as fixed, the elements comprising one or more of wiring, vias, active regions, device isolation regions, source/drain regions, channel regions, and gate regions.

Methods may comprise creating a modified layout of a modified integrated circuit by replacing the first layout portion with a second layout portion; creating a plurality of modified photolithographic masks using the modified layout of the integrated circuit; and creating a modified integrated circuit layout using the plurality of modified photolithographic masks.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The use of the terms "a" and "an" and "the" and similar referents (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, referring to FIGS. 1 to 9 and 13, a method for manufacturing an integrated circuit according to an embodiment of the present invention will be described.

Figure 1:
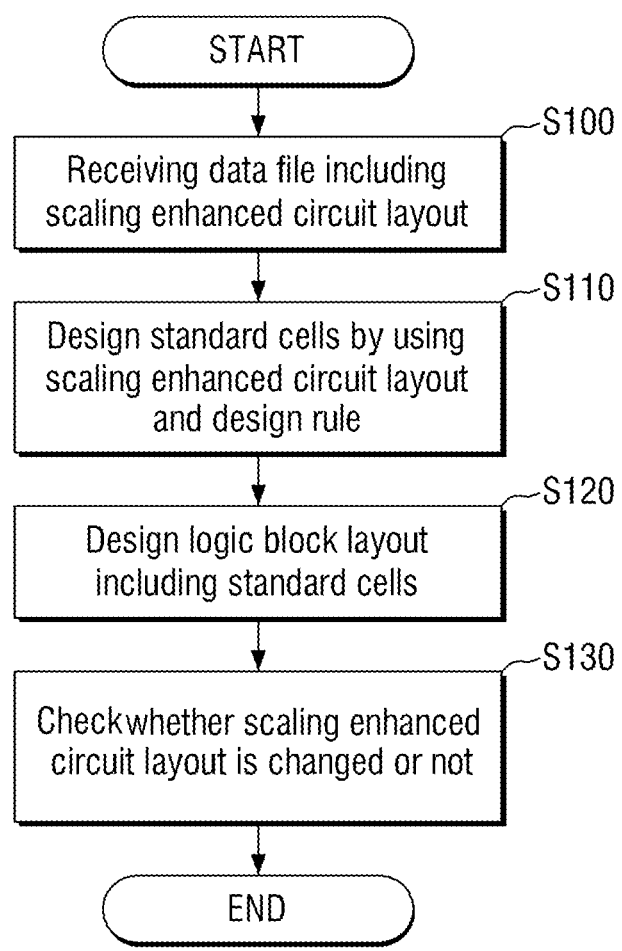
FIG. 1 is a flowchart explaining a method for designing an integrated circuit according to an embodiment of the present invention.
Figure 7:
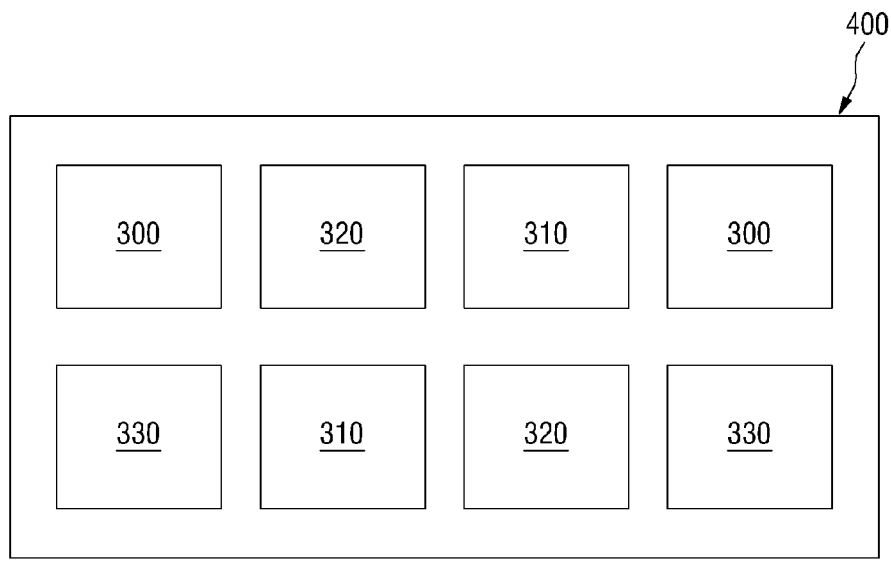
FIG. 7 is a diagram explaining S120 of FIG. 1.
Figure 8:
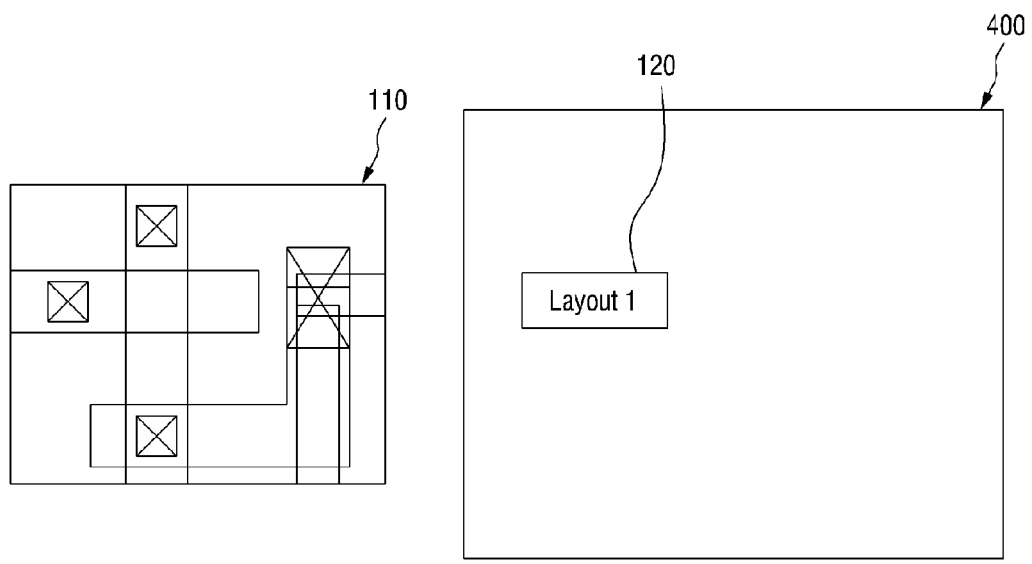
FIG. 8 is a diagram explaining S130.
Figure 9:
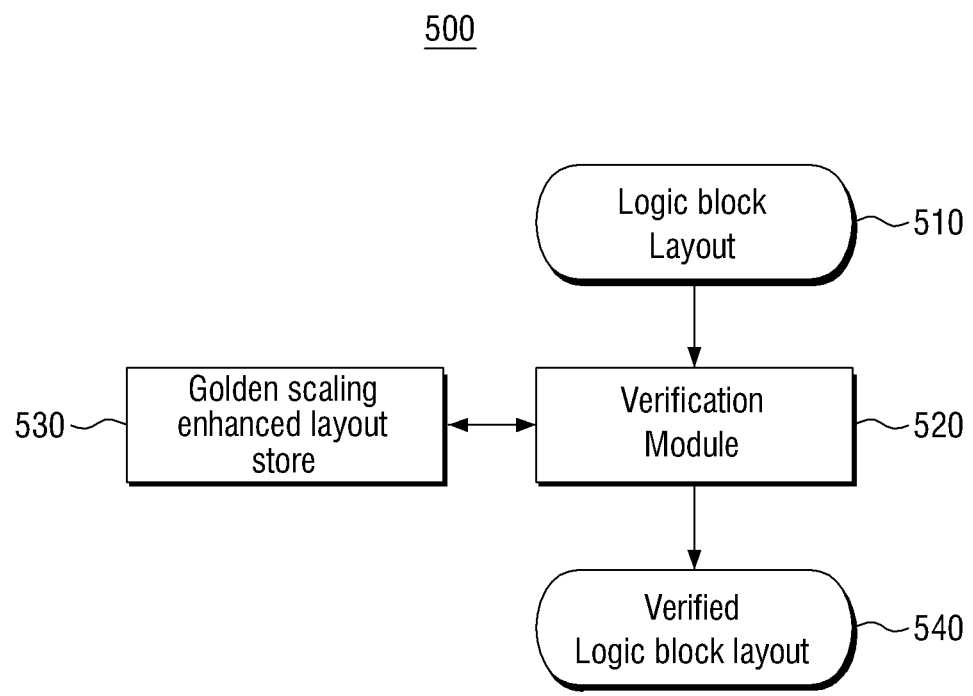
FIG. 9 is a block diagram explaining a system for verifying an integrated circuit, which executes S130 of FIG. 1.
Figure 13:
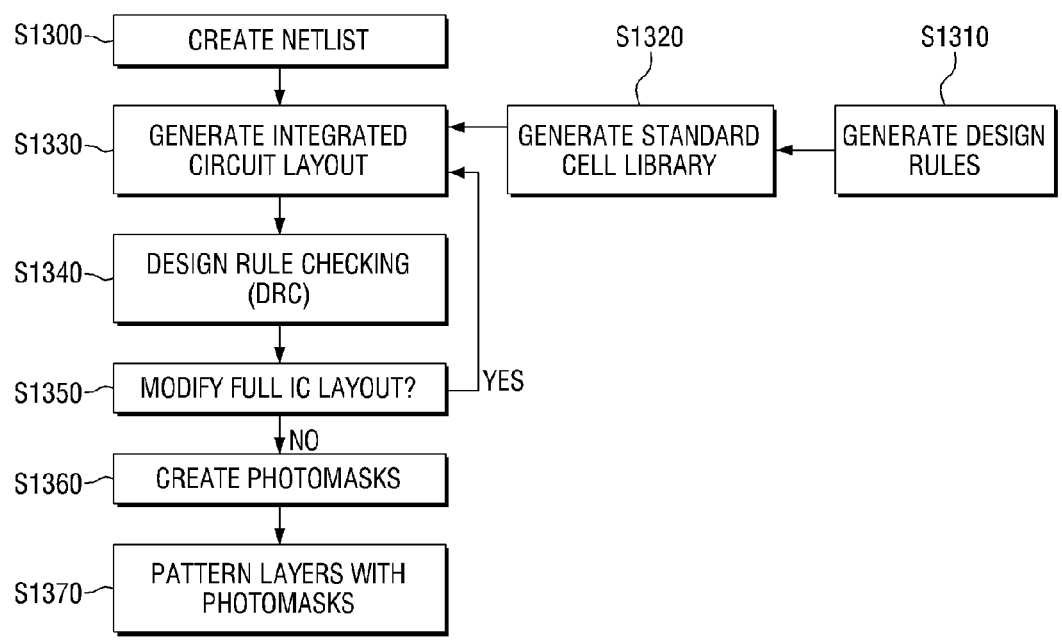
FIG. 13 is a flowchart illustrating a manufacturing process.

FIG. 1 is a flowchart explaining a method for designing an integrated circuit according to an embodiment of the present invention. FIGS. 2 to 5 are a flowchart and diagrams describing an example of step S100 of FIG. 1. FIGS. 6A to 6D are diagrams describing an example of step S110 of FIG. 1, FIG. 7 is a diagram explaining S120 of FIG. 1, and FIG. 8 is a diagram describing an example of step S130. FIG. 9 is a block diagram describing an example of step a system for verifying an integrated circuit, which executes S130 of FIG. 1. FIG. 13 is a flowchart illustrating the manufacturing process of an integrated circuit, including methods of designing according to FIGS. 1 to 9.

Referring to FIG. 13, a netlist is generated in step S1300. The net list may comprise a gate level netlist, and, as is known, may comprise a plurality of instances, their gate level logic function (e.g., NAND logic, NOR logic, inversion, etc.) and interconnections between these instances. The netlist may be generated by hardware description language (e.g., Verilog) provided by a circuit engineer.

In step S1310, a plurality of design rules are created. These design rules may be provided by process engineers that design various semiconductor processes to create various portions of an integrated circuit. For example, an engineer specializing in plasma processing used for etching, may provide design rule(s) designating a minimum via (or contact hole) size, whereas an engineer specializing in chemical mechanical polishing, may provide design rule(s) describing wiring densities which may require the use of dummy patterns in certain circumstances.

In step S1320, a plurality of standard cell layouts are created to form a standard cell library. The standard cell layouts may comprise a layout design to implement a logic function of a corresponding instance of the netlist. A standard cell layout may describe a plurality of layers and their patterning that form the elements of the standard cell layout, such as one or more of wiring, vias, active regions of a semiconductor substrate, device isolation regions in a semiconductor substrate (e.g., to define the active regions), source/drain regions of transistors, channel regions of transistors, gate regions of transistors, etc. Some of the standard cells layouts may be designed to conform (not violate) the plurality of design rules. Other of the standard cell layouts may be designed so that a first layout region may violate one or more of the plurality of design rules and another region does not violate the one or more design rules. The first layout region may be separately designed and correspond to a graphical representation of a portion of the standard cell layout. The first layout region may be fixed so that the representation of this region does not vary (e.g., in size, relative location and location of its elements) whereas the other region may be allowed to vary. Further exemplary detail of the standard cell layouts are described herein in further detail, e.g., with respect to FIGS. 1-12. For example, some of the standard cell layouts may correspond to the standard cells, such as target standard cell 100, described below.

In step S1330, an integrated circuit layout is generated, such as the layout for the entire integrated circuit. The integrated circuit layout may be generated by a place and routing function, using the gate level netlist and the standard cell layouts of the standard cell library. Standard cells layouts may correspond to instances of the netlist so that logical functions of an instance of the netlist may be implemented by the layout structure of the corresponding standard cell layout.

In step S1340, design rule checking may be performed on the integrated circuit layout to determine if it violates any of the design rules. Portions of the layout that correspond to the first layout region (or similar regions) may be identified and design rule violations corresponding to these portions may be ignored or may not be tested for design rule violations. If there are design rule violations in other portions not identified so, the layout may be modified (step S1350) and tested again at step S1340 until it passes this design rule checking step.

In step S1360, photomasks may be created based upon the integrated circuit layout. In step S1370, a plurality of layers may be formed on a semiconductor substrate. The plurality of layers may be patterned using the photomasks created in step S1350. The patterned layers may correspond to the integrated circuit layout and portions of these patterned layers may correspond to standard cells of the standard cell library. The thus formed integrated circuit may be packaged in a semiconductor package and used in various manners in systems according to its intended use.

Referring to FIGS. 1 to 5, a first data file 120*f* that includes a first scaling enhanced circuit layout 120 is received (S100). Further, a second data file 130*f* including a second scaling enhanced circuit layout 130 that is different from the first scaling enhanced circuit layout 120 is received.

While the first data file 120f and the second data file 130f are received, a set of design rules may also be received. The design rules may be a set of parameters that set forth certain requirements of the layout to be manufactured. They may be provided as a computer file, a design rule manual or may be embodied in design rule checking software and/or systems.

The design rule variables may be provided by an integrated circuit designer. Through the above-described design rule, the integrated circuit designer can verify accuracy of a photomask set to be made through the integrated circuit layout design and/or the accuracy of the integrated circuit layout itself. The design rule may include, for example, a width rule, a minimum area rule, a space rule, an enclosure rule, a symmetry rule, an alignment rule, and the like. For example, a width rule may specify the minimum width of any pattern element in the integrated circuit layout design (or mask); a minimum area rule may specify a minimum area of a pattern element of the integrated circuit layout design (or mask); a space rule may specify the minimum distance between two adjacent pattern elements; an enclosure rule may specify that an object of one type, such as a contact or via, should be covered with some additional margin by a second object, such as a metal layer.

The design rules may include, for example, ground rules that are generally applicable. The design rules may also comprise a special structure rules that are applied to certain identified structures so that a margin is applied more severely in comparison to the ground rule. The design rule may be provided to the integrated circuit designer in the form of a document, computer file, a design rule manual, etc.

Unlike the design rules, the first scaling enhanced circuit layout 120 and the second scaling enhanced circuit layout 130 may be provided to the integrated circuit designer in the form of a graphic file.

The first data file 120f and the second data file 130f may be one of a graphic database system (GDS) file, a graphic database system (GDS) instance file, and a hard macro file, but are not limited thereto. That is, it is enough if the first data file 120f and the second data file 130f are in a graphic file format that can indicate the layout of the circuit. Examples of known GDS language that may be used for the first and second data files 120f and 130f include GDSII (or GDSII Stream Format) and OASIS (Open Artwork System Interchange Standard).

The first scaling enhanced circuit layout 120 and the second scaling enhanced circuit layout 130 may be provided to the integrated circuit designer, for example, in one form of the graphic database system, graphic database system instance, and hard macro.

Hereinafter, referring to FIGS. 2 to 5, a procedure of generating the first data file 120f and the second data file 130f, which include the first scaling enhanced circuit layout 120 and the second scaling enhanced circuit layout 130, respectively, will be described.

Referring to FIGS. 2 to 5, a part of a target standard cell 100 is defined as a design rule violation requisite region 105 (S11).

The target standard cell 100 may be a basic cell that is required to configure a logic circuit. That is, the target standard cell 100 may be a circuit configuration element that performs a specific function. For example, the target standard cell 100 may be a NAND circuit standard cell, a NOR circuit standard cell, an inverter circuit standard cell, or a flip-flop circuit standard cell, but is not limited thereto.

The design rule violation requisite region 105 is a part of the target standard cell 100, and thus may not perform any specific logic function. That is, the design rule violation requisite region 105 may be a part of a standard cell layout that performs a specific logic function (e.g., a logical NAND or NOR operation, a logical inversion operation, or a data latching operation). For example, if the standard cell layout is a layout for a NAND circuit, standard cell layout may comprise two PMOS transistors, two NMOS transistors and wiring for two inputs, an output and interconnections between the transistors, the inputs and output. As is known, these elements may be formed in various manners and represented in the standard cell layout as features in a semiconductor substrate (e.g., active regions of a semiconductor substrate (e.g., defined by isolation regions (insulating material, such as silicon oxide) embedded in the substrate) which form transistor source/drain regions and channel regions) and as features formed by patterned conductive layers and insulating layers formed on the semiconductor substrate (e.g., metal or polysilicon conductive layers patterned to form transistor gates and wiring interconnections, connected by conductive vias extending through insulating layers). The design rule violation requisite region 105 may be a selected part of the standard cell layout, and thus may include one or more of elements of the standard cell layout such as, e.g., one or more wiring interconnections, vias or contact holes, active regions, isolation regions, source/drain regions, channel regions, gates, etc.). Such collection of the elements may or may not be connected to each other within the design rule violation requisite region 105.

The design rule violation requisite region 105 may not only be a part of one standard cell layout, but also a part of various standard cell layouts. That is to say, the design rule violation requisite region 105 may define or represent a common part included in various standard cell layouts.

The design rule violation requisite region 105 defines, for example, a portion of the target standard cell 100, in which improvement of scaling and improvement of a manufacturing process are desired. That is, the design rule violation requisite region 105 can correspond to a portion of the cell layout that is challenging to manufacture, such as due to limitations in processes used during manufacturing.

For example, in the case of implementing a cross-couple in a region of a given standard cell, a diagonal contact plug that considers a process margin should be designed in the standard cell. It is difficult to describe such a complicated structure through the design rule. Even if the complicated structure is described through the design rule, it is quite difficult to make a layout with the same structure as the structure intended by a design rule developer.

Accordingly, the region, which is difficult to be described through the design rule or in which it is difficult to generate the same layout even if the region is described through the design rule, is defined as the design rule violation requisite region 105.

Figure 3:
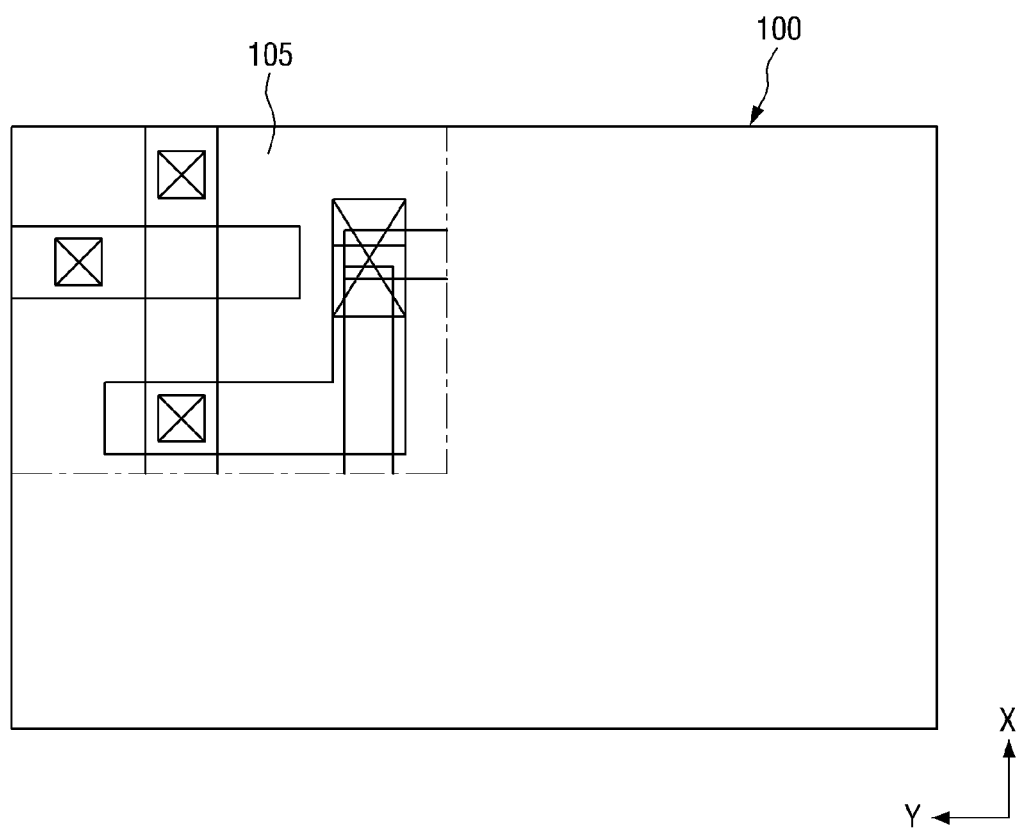

The design rule violation requisite region 105 illustrated in FIG. 3 is only for convenience in explanation, but is not limited thereto.

Figure 2:
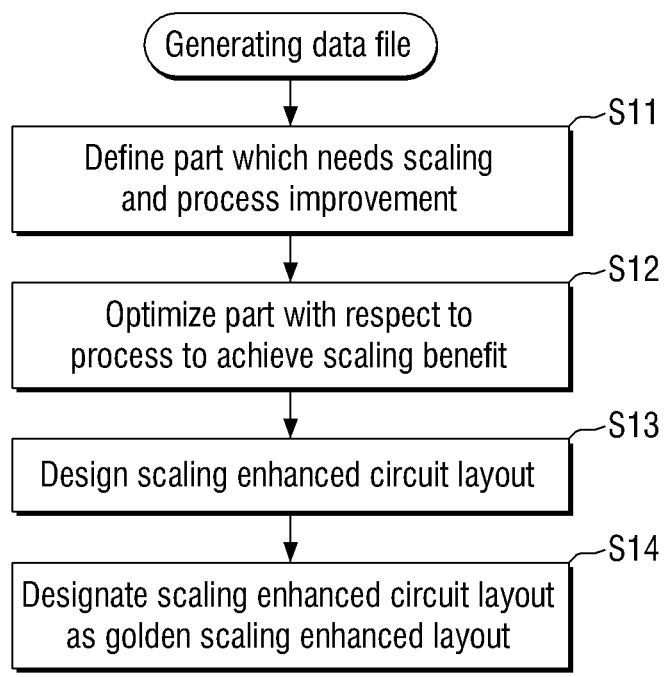
FIGS. 2 to 5 are a flowchart and diagrams explaining S100 of FIG. 1.

Referring to FIG. 2, in order to achieve the advantage of scaling-down, the portion that is defined as the design rule violation requisite region 105 is optimized from the viewpoint of the manufacturing process (S12). That is, from the viewpoint of the manufacturing process, the layout of the design rule violation requisite region 105 is optimized.

It is not necessary to optimize the layouts of all layers included in the design rule violation requisite region 105.

That is, from the viewpoint of the manufacturing process, the layout optimization may be performed with respect to at least a part of several layers included in the design rule violation requisite region 105. The remaining layers within the boundary (from a top down view) of the design rule violation requisite region 105 may be part of the remaining portion of the target standard cell 100 and treated accordingly.

The remaining portion of the target standard cell 100 (that is, the portion of the target standard cell 100 that is not design rule violation requisite region 105) may conform to the design rules, such as those defined by and provided by process engineers. The remaining portion may be modified according to the need set forth by the integrated circuit designer so long as the design rules are not violated. For example, an integrated circuit designer may design a circuit requiring a NAND gate used as part of decoder to drive a word line. The NAND gate may require certain sized transistors (e.g., as designed by the integrated circuit designer) in order to drive the word line. As such, use of the standard cell NAND gate in implementing this decoder part may be used. The parameters describing the size of the transistors may affect the size of the standard cell as implemented in the integrated circuit, and various portions of the standard cell NAND gate may be modified (e.g., such as size, locations and/or relative locations of wiring, transistors, vias, etc.) so long as the design rules are not violated. However, as noted, the design rule violation requisite region 105 (which may be a portion of the standard cell NAND gate) may violate one or more design rules. By fixing the design rule violation requisite region 105 to a particular structure, such as fixing the design rule violation requisite region 105 to correspond to a graphical representation of the same, the design rule violation requisite region 105 may violate design rules and still be operable. Thus, scaling of the target standard cell 100 may be achieved by reducing the size of the elements defined by the design rule violation requisite region 105 in a simple manner.

Accordingly, a design rule violation layer is designed through optimization of the manufacturing process with respect to at least a part of the design rule violation requisite region 105.

Referring to FIGS. 2, 4A and 4B, and 5, the first scaling enhanced circuit layout 120 including the design rule violation layer that is designed through optimization of the manufacturing process is designed (S13). The first scaling enhanced circuit layout 120 is a layout in which the design rule violation requisition region 105 is optimized from the viewpoint of the manufacturing process.

Since the design rule violation requisite region 105 is a part of the target standard cell 100, the first scaling enhanced circuit layout 120 that is designed on the basis of the design rule violation requisite region 105 becomes a part of the target standard cell layout. Accordingly, the target standard cell 100 that is manufactured on the basis of the first scaling enhanced circuit layout 120 is able to perform the specific function associated with the target standard cell 100 even though a portion of the target standard cell 100 may violate design rules. It should be noted that in practice, defects may arise in the manufactured integrated circuit, including defects in the manufactured target standard cell 100 with the design rule violation requisite region 105, and possibly within the design rule violation requisite region 105. However, defects may be expected and if their occurrence is small enough, the integrated circuit design may still be acceptable to the integrated circuit designer.

For convenience in explanation, it is assumed that the design rule violation layer is provided through optimization of the design rule violation requisite region 105 illustrated in FIG. 3 from the viewpoint of the manufacturing process. That is, explanation will be made on the assumption that the design rule violation layer and the first scaling enhanced circuit layout 120 are the same.

However, the present invention is not limited thereto. It is also possible to design the design rule violation layer through optimization of only a part of a plurality of layers included in the design rule violation requisite region 105.

Then, the first scaling enhanced circuit layout 120 is designated as a golden scaling enhanced layout 110 (S14). Further, the designated golden scaling enhanced layout 110 may be registered.

The first scaling enhanced circuit layout 120 and the golden scaling enhanced layout 110 may be the same layout.

The golden scaling enhanced layout 110 may include only a circuit layout as shown in FIG. 4A, or may be a golden scaling enhanced layout 110m that includes a marker layer 115 as shown in FIG. 4B. The marker layer 115 may be part of the graphic data file and be used to identify the location of the first scaling enhanced circuit layout 120, but may not correspond to any structure in the manufactured integrated circuit. For example, the marker layer 115 may be used to identify the location of the first scaling enhanced circuit layout 120 so that subsequent design rule checks may ignore design rule violations (or, alternatively, skip design rule checks) of the appropriate portion of a layout that is identified by the marker layer 115 (such as corresponding in location to the maker layer 115). For example, design rule checking may be skipped or design rule violations of any portion of a layout identified by marker layer 115 may be ignored—either a standard cell layout, such as target standard cell 100, or a larger layout, such as a logic block layout or full integrated circuit layout. Marker layer 115 may be described in the graphic data file (e.g., GDS file) describing such layouts.

Then, the first data file 120f that includes the first scaling enhanced circuit layout 120 is generated. The generated first data file 120f is provided to the integrated circuit designer.

The first scaling enhanced circuit layout 120 included in the first data file 120f may include the marker layer 115 as illustrated in FIG. 4B, but is not limited thereto.

It may be disadvantageous from the viewpoint of scaling to design the integrated circuit according to the design rules, but it may be advantageous from the viewpoint of the integrated circuit implementation.

If an integrated circuit designer has designed an integrated circuit layout that is against one or more design rules, it is not known whether the layout that violates the design rule can be implemented as an actual integrated circuit. That is, the integrated circuit designer is fortunate if he/she can implement the layout that violates the design rule as the integrated circuit through optimization of the manufacturing process, but otherwise, it may be necessary to re-design the integrated circuit.

Through optimization of the manufacturing process, the integrated circuit designer can implement a layout of the integrated circuit that violates one or more design rules as the actual integrated circuit. For example, the integrated circuit designer may implement the layout of the integrated circuit that violates one or more design rules due to adjustment of manufacturing process conditions and/or recognizing the that certain design rules may have been chosen (or their values chosen) to apply for all layout situations, but may not be applicable for a particular layout feature (e.g., where manufacturing process conditions may be adjusted without undesirable results).

Further, when manufacturing a photo mask using the integrated circuit layout, the integrated circuit manufacturer can use, for example, an optical proximity correction (OPC) method or the like. That is, through adjustment of the conditions in the step of manufacturing a photo mask, the integrated circuit manufacturer can implement a complicated pattern that violates one or more design rules.

The integrated circuit designer designs the integrated circuit layout on the basis of the design rule, whereas the integrated circuit manufacturer implements the integrated circuit through optimization of the actual manufacturing process. Accordingly, the integrated circuit manufacturer can optimize the structure which is against the design rule or which is too complicated to be expressed through the design rule from the viewpoint of the manufacturing process, and can make the structure as the scaling enhanced circuit layout.

Accordingly, the design of the standard cell layout using the scaling enhanced circuit layout can improve the scaling-down of the standard cell in comparison to the design of the standard cell layout that follows the design rule.

Figure 4:
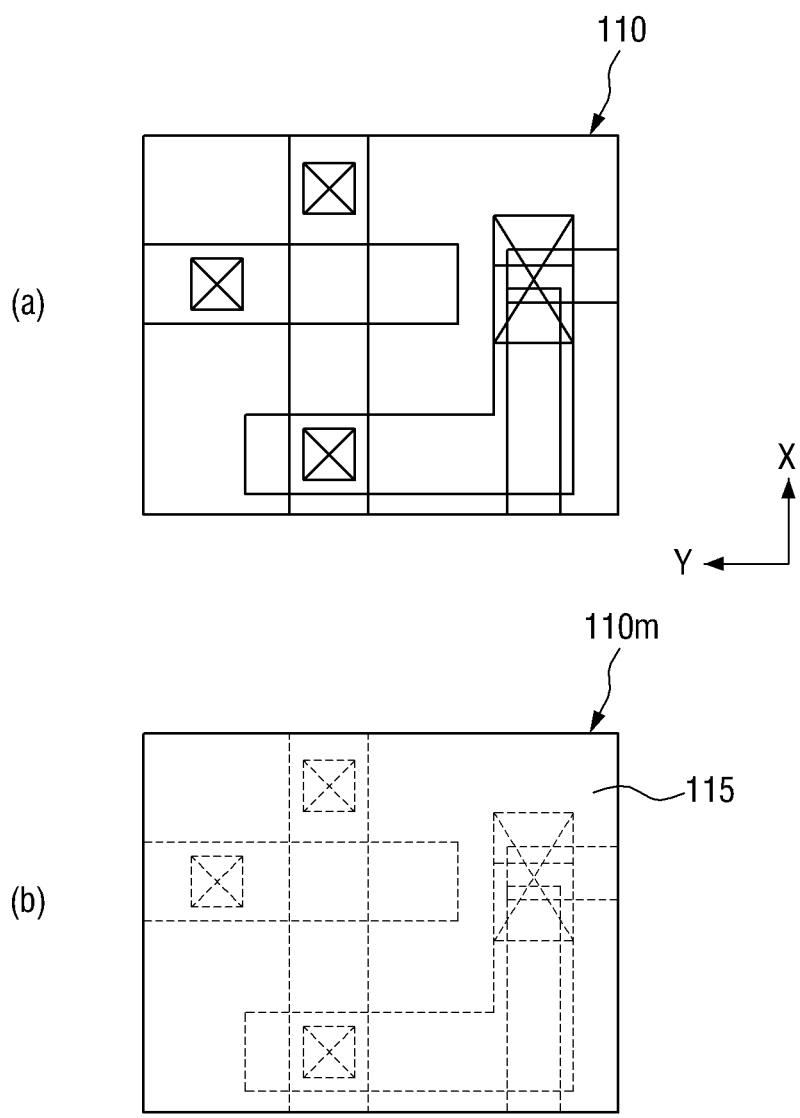

FIGS. 3 and 4 illustrate that one golden scaling enhanced layout 110 is designed, but the present invention is not limited thereto. That is, in the target standard cell 100, a region having a structure that is different from the structure of the design rule violation requisite region 105 can be defined as an additional design rule violation requisite region, and the corresponding scaling enhanced circuit layout can be designed.

Further, multiple design rule violation requisite regions may be designed, either as part of the same target standard cell or in different standard cells. For example, in a target standard cell that is different from the target standard cell 100 of FIG. 3, a region having a structure that is different from the structure of the design rule violation requisite region 105 of FIG. 3 can be defined as an additional design rule violation requisite region, and the corresponding scaling enhanced circuit layout can be designed.

Figure 5:
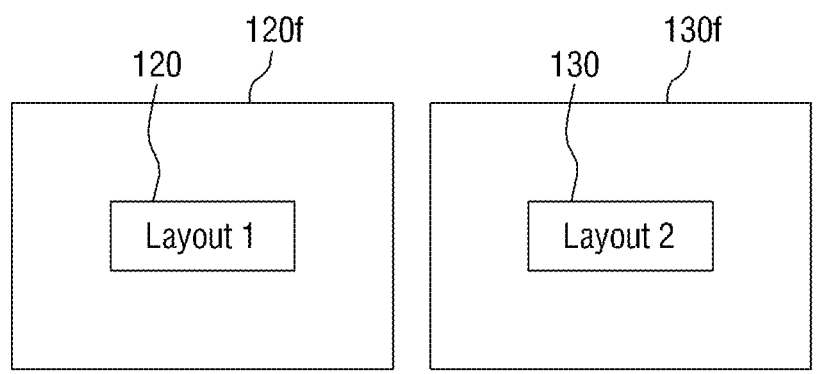

Further, once a design rule violation requisite region 105 is designed (e.g., it is qualified and may be considered a golden scaling enhanced layout 110), it may be used as part of standard cells other than the target standard cell 100 for which it was originally designed. In FIG. 5, the second scaling enhanced circuit layout 130 included in the second data file 130f may be the layout that was designed for target standard cell 100 (e.g., as provided in first data file 120f with layout 120) through optimization of the manufacturing process of the above-described additional design rule violation requisite region 105.

Referring to FIGS. 1 and 6A to 6D, first to fourth standard cell layouts 300, 310, 320, and 330 are designed using the design rule, the first data file 120f, and the second data file 130f (S110).

Figure 6A:
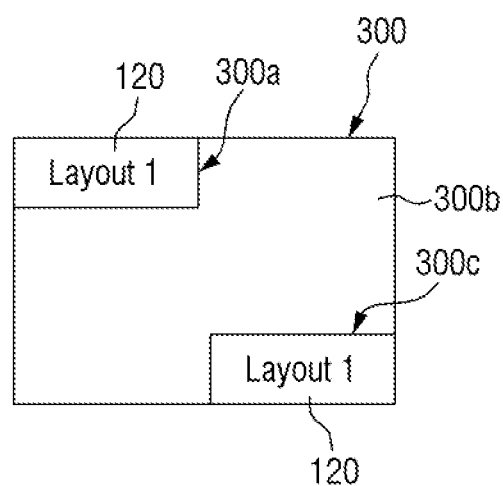
FIGS. 6A to 6D are diagrams explaining S110 of FIG. 1.

Referring to FIG. 6A, designing of the first standard cell layout 300 using the design rule and the first data file 120f will be exemplarily described.

The first standard cell layout 300 may include a first region 300a, a second region 300b, and a third region 300c. The second region 300b of the first standard cell layout may be a region that is adjacent to the first region 300a of the first standard cell layout and the third region 300c of the first standard cell layout. The second region 300b of the first standard cell layout may be positioned in the vicinity of the first region 300a of the first standard cell layout and in the vicinity of the third region 300c of the first standard cell layout.

The first region 300a of the first standard cell layout and the third region 300c of the first standard cell layout may be different regions of the first standard cell layout 300.

The first region 300a of the first standard cell layout is designed using the first data file 120f. Designing of the first region 300a of the first standard cell layout may correspond to arrangement of the first scaling enhanced circuit layout 120 in the first region 300a of the first standard cell layout.

The integrated circuit designer receives the first scaling enhanced circuit layout 120 in the form of graphic data, the first scaling enhanced circuit layout 120 may be arranged in the first region 300a of the first standard cell layout without any additional designing process. The first region 300a may be fixed to correspond to the graphic data and may not be modified, such as modified in size or relative location of its elements.

When the first region 300a of the first standard cell layout is designed, the third region 300c of the first standard cell layout can also be designed. That is, the first scaling enhanced circuit layout 120 may be arranged in the third region 300c of the first standard cell layout.

Then, the second region 300b of the first standard cell layout is designed using the design rules. The second region 300b may be variable and may be limited in its ability to be varied by design rules (e.g., it may be varied in size, locations and/or relative location of its elements, such as size, locations and/or relative locations wiring, vias, source/drain regions, channel regions, gate structures, etc.) More specifically, designing of the second region 300b of the first standard cell layout corresponds to designing of surroundings of the first region 300a of the first standard cell layout in which the first scaling enhanced circuit layout 120 is arranged and the third region 300c of the first standard cell layout using the design rule.

When the second region 300b of the first standard cell layout is designed, the surrounding patterns of the first scaling enhanced circuit layout 120 and the first standard cell layout 300 that are respectively arranged in the first region 300a and the third region 300c of the first standard cell layout may be considered.

Next, designing of the second standard cell layout 310, the third standard cell layout 320, and the fourth standard cell layout 330, which perform different functions from the function of the first standard cell layout 300 will be described.

The first to fourth standard layouts 300, 310, 320, and 330 may be different standard cell layouts that perform different functions from each other.

FIGS. 6A to 6D illustrate four standard cell layouts 300, 310, 320, and 330. However, this is only for convenience in explanation, but the standard cell layouts are not limited thereto. In addition, FIGS. 6A to 6D illustrate designing of the standard cell layouts using the first and second scaling enhanced circuit layouts 120 and 130 which are different from each other. However, this is only for convenience in explanation, but the designing of the standard cell layouts is not limited thereto.

Figure 6B:
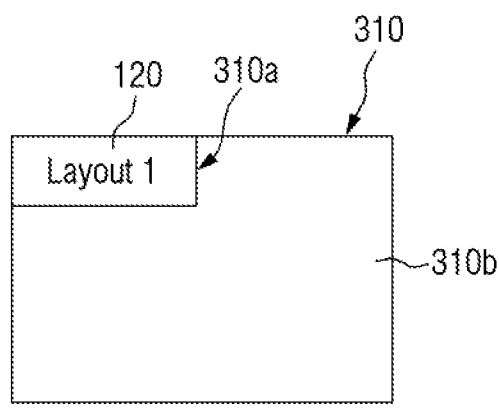

In FIG. 6B, the second standard cell layout 310 may include the first region 310a and the second region 310b. The second region 300b of the first standard cell layout may be positioned in the vicinity of the first region 300a of the first standard cell layout.

Unlike the first standard cell layout 300, the second standard cell layout 310 may include one first scaling enhanced circuit layout 120.

In FIGS. 6A and 6B, the first standard cell layout 300 and the second standard cell layout 310 that perform different functions may include the same first scaling enhanced circuit layout 120.

Figure 6C:
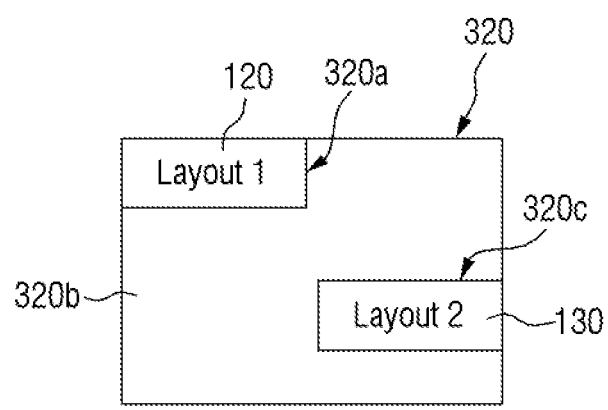

Referring to FIG. 6C, designing of the third standard cell layout 320 using the design rule, the first data file 120*f*, and the second data file 130*f* will be described.

The third standard cell layout 320 may include a first region 320*a*, a second region 320*b*, and a third region 320*c*. The second region 320*b* of the third standard cell layout may be a region that is adjacent to the first region 320*a* of the third standard cell layout and the third region 320*c* of the third standard cell layout. The second region 320*b* of the third standard cell layout may be positioned in the vicinity of the third region 320*a* of the third standard cell layout and in the vicinity of the third region 320*c* of the third standard cell layout.

The first region 320*a* of the third standard cell layout is designed using the first data file 120*f*. Designing of the first region 320*a* of the third standard cell layout may correspond to arrangement of the first scaling enhanced circuit layout 120 in the first region 320*a* of the third standard cell layout.

Further, the third region 320*c* of the third standard cell layout is designed using the second data file 130*f*. Designing of the third region 320*c* of the third standard cell layout may correspond to arrangement of the second scaling enhanced circuit layout 130 in the third region 320*c* of the third standard cell layout.

Then, the second region 320*b* of the third standard cell layout is designed using the design rule. More specifically, designing of the second region 320*b* of the third standard cell layout corresponds to designing of surroundings of the first region 320*a* of the third standard cell layout in which the first scaling enhanced circuit layout 120 is arranged and the third region 320*c* of the third standard cell layout in which the second scaling enhanced circuit layout 130 is arranged using the design rule.

When the second region 320*b* of the third standard cell layout is designed, the surrounding patterns of the first scaling enhanced circuit layout 120, the second scaling enhanced circuit layout 130, and the third standard cell layout 320 may be considered.

Figure 6D:
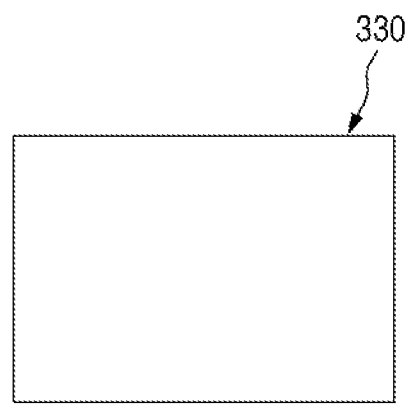

In FIG. 6D, the fourth standard cell layout 330 does not include the scaling enhanced circuit layout, and may be entirely designed using the design rule.

As described above, the designed first to fourth standard cell layouts 300, 310, 320, and 330 may be made in the form of graphic data. The designed first to fourth standard cell layouts 300, 310, 320, and 330 in the form of the graphic data may be provided to a designer that designs a logic block layout. For example, graphic data may be used to describe layout 1 and layout 2 for corresponding ones of regions 300*a*, 300*c*, 310*a*, 320*a* and 320*c*. The graphic data may be fixed so that the features that the graphic data represents may be altered in size, location and/or relative location. Other portions of the standard cell layouts (such as regions 300*b*, 310*b*, 320*b* and 330) may be variable, based on the integrated circuit designers input in designing the overall integrated circuit.

Although not illustrated in FIG. 1, the design rule may be checked with respect to the first to fourth standard cell layouts 300, 310, 320, and 330 using a design rule checker (DRC). For example, the design rule checker may be used to verify conformance with design rules for regions 300*b*, 310*b*, 320*b* and 330, but may be programmed to ignore or not check design rule violations for regions 300*a*, 300*c*, 310*a*, 320*a* and 320*c*.

When the design rule of the first to fourth standard cell layouts 300, 310, 320, and 330 is checked, a part of the standard cell layout, in which the first scaling enhanced circuit layout 120 and/or the second scaling enhanced circuit layout 130 are arranged (e.g., regions 300*a*, 300*c*, 310*a*, 320*a* and 320*c*), may not be checked through the design rule checker.

Through the marker layer included in the first scaling enhanced circuit layout 120 and/or the second scaling enhanced circuit layout 130, positions in which the first scaling enhanced circuit layout 120 and/or the second scaling enhanced circuit layout 130 are arranged can be confirmed.

Further, when the design rule of the first to fourth standard cell layouts 300, 310, 320, and 330 is checked, it may be considered that a part of the standard cell layout, in which the first scaling enhanced circuit layout 120 and/or the second scaling enhanced circuit layout 130 are arranged, satisfies the design rule.

In the case where the design rule of the first to fourth standard cell layouts 300, 310, 320, and 330 is checked, design rule checking of a logic block layout may be omitted after the logic block layout to be described later is designed.

Referring to FIGS. 1, 6, and 7, a logic block layout 400 that includes the first to fourth standard cell layouts 300, 310, 320, and 330 is designed.

A logic block designer arranges the first to fourth standard cell layouts 300, 310, 320, and 330 in the logic block layout 400 so that a logic integrated circuit to be implemented can be manufactured through the logic block layout 400.

At least one standard cell layout of the first to fourth standard cell layouts 300, 310, 320, and 330 includes the first scaling enhanced circuit layout 120 and/or the second scaling enhanced circuit layout 130.

Accordingly, the logic block layout 400 includes the first scaling enhanced circuit layout 120 and/or the second scaling enhanced circuit layout 130. The first scaling enhanced circuit layout 120 and/or the second scaling enhanced circuit layout 130 are arranged in a partial region of the logic block layout 400.

The logic block layout 400 as designed above may be made in the form of graphic data. The made logic block layout 400 in the form of graphic data may be provided to an integrated circuit manufacturer that manufactures the integrated circuit.

Although not illustrated in FIG. 1, the design rule may be checked with respect to the logic block layout 400 using the design rule checker.

When the design rule of the logic block layout 400 is checked, a portion of the logic block layout 400, in which the first scaling enhanced circuit layout 120 and/or the second scaling enhanced circuit layout 130 are arranged, may not be checked through the design rule checker. For example, the design rule checker may be used to verify conformance with design rules for regions 300*b*, 310*b*, 320*b* and 330, but may be programmed to ignore or not check design rule violations for regions 300*a*, 300*c*, 310*a*, 320*a* and 320*c*. The design rule checker may be responsive to the marker layer 115 in determining to ignore or not check design rule violations of the appropriate regions of the logic block layout 400.

Further, when the design rule of the logic block layout 400 is checked, the portion in which the first scaling enhanced circuit layout 120 and/or the second scaling enhanced circuit layout 130 are arranged (e.g., regions 300a, 300c, 310a, 320a and 320c), may be processed as the portion that satisfies the design rule.

Referring to FIGS. 1, 8, and 9, it is checked whether the first scaling enhanced circuit layout 120 included in the logic block layout 400 is changed in the process of designing the standard cell layouts 300, 310, 320, and 330 or in the process of designing the logic block layout 400 (S130).

The original of the first scaling enhanced circuit layout 120 included in the logic block layout 400 may be the golden scaling enhanced layout 110 as described above with reference to FIGS. 4A and 4B. That is, it can be confirmed whether the first scaling enhanced circuit layout 120 included in the logic block layout 400 is changed in the process of designing the standard cell layouts or the logic block layout.

The process of designing the first standard cell layout 300 illustrated in FIG. 6A will be exemplarily described. The second region 300b of the first standard cell layout is designed after the first scaling enhanced circuit layout 120 is arranged in the first region 300a of the first standard cell layout.

That is, in the process of designing the second region 300b of the first standard cell layout using the design rule, the first scaling enhanced circuit layout 120 that is arranged in the first region 300a of the first standard cell layout may be changed due to a designer's intention or mistake.

The first scaling enhanced circuit layout 120 is optimized from the viewpoint of the manufacturing process. The first scaling enhanced circuit layout 120 may be changed during the designing process, and if the photo mask is manufactured using the changed first scaling enhanced circuit layout, the logic integrated circuit that is manufactured through the photo mask may not be operated according to the designer's intention. Since the photo mask is manufactured using the changed first scaling enhanced circuit layout, there is a possibility that the logic integrated circuit manufactured using the photo mask is also changed.

By verifying the first scaling enhanced circuit layout 120 included in the logic block layout 400 using the golden scaling enhanced layout 110, the stability of the manufacturing process and the performance of the logic integrated circuit that is manufactured through the logic block layout can be secured.

Referring to FIGS. 4A and 4B, 8, and 9, an integrated circuit verification system 500 that verifies the designed logic block layout 400 may include a first input module 510, a first storage 530, a verification module 520, and a display 540.

The first input module 510 may receive an input of the logic block layout 400 that includes the first scaling enhanced circuit layout 120. The first input module 510 may receive the input in the form of graphic data.

The first storage 530 may be a portion where the golden scaling enhanced layout 110 that is the original of the first scaling enhanced circuit layout 120 is stored. However, this is only for convenience in explanation, but the present invention is not limited thereto. That is, a separate input module that receives the input of the golden scaling enhanced layout 110 that is the original of the first scaling enhanced circuit layout 120 may be additionally provided.

The verification module 520 determines whether the first scaling enhanced circuit layout 120 is changed in the designing process through comparison of the first scaling enhanced circuit layout 120 in the logic block layout 400 that is input to the first input module 510 with the golden scaling enhanced layout 110 of the first storage 530.

The verification module 520 can read out what position in the logic block layout 400 the first scaling enhanced circuit layout 120 is arranged in through confirming of the marker layer included in the first scaling enhanced circuit layout 120.

The display 540 may display whether the first scaling enhanced circuit layout 120 that is verified through the verification module 520 is changed.

Referring to FIGS. 1 to 12, a method for designing an integrated circuit according to another embodiment of the present invention will be described.

Figure 10:
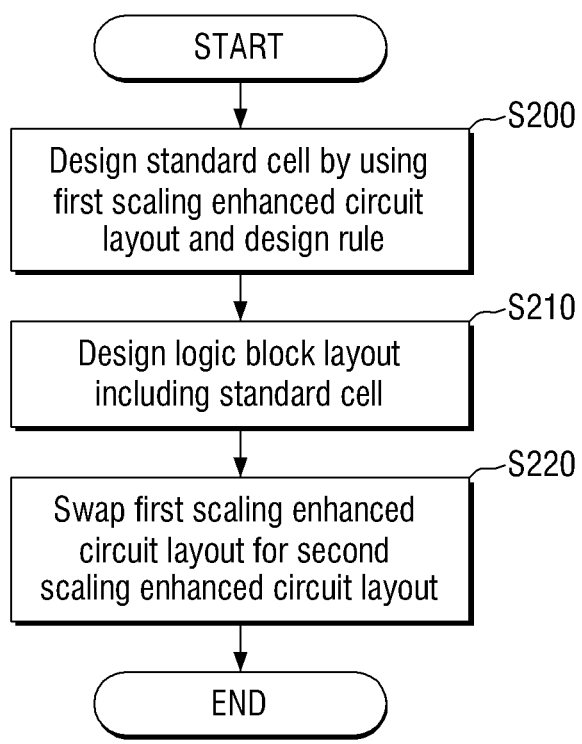
FIG. 10 is a flowchart explaining a method for designing an integrated circuit according to another embodiment of the present invention.
Figure 11A:
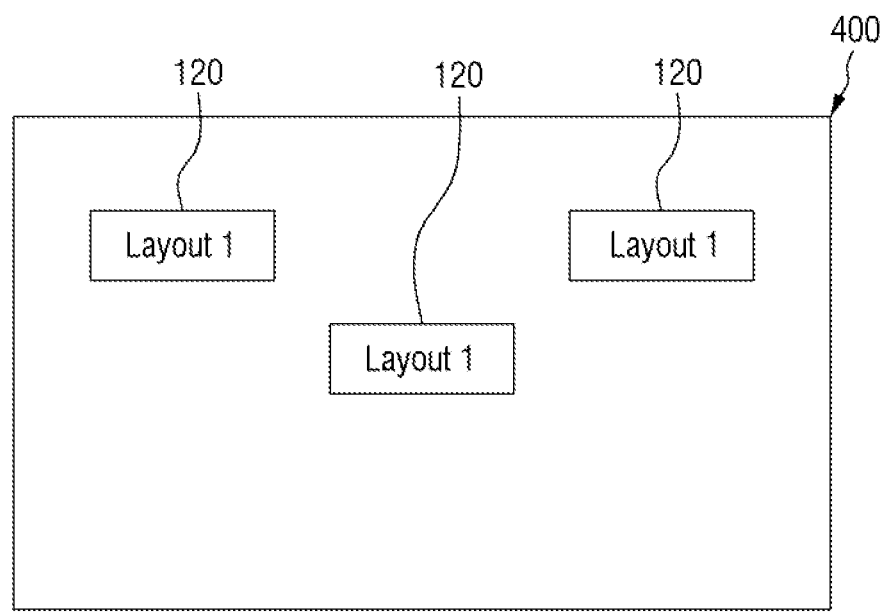
FIGS. 11A to 11C are diagrams explaining S220 of FIG. 10.
Figure 11B:
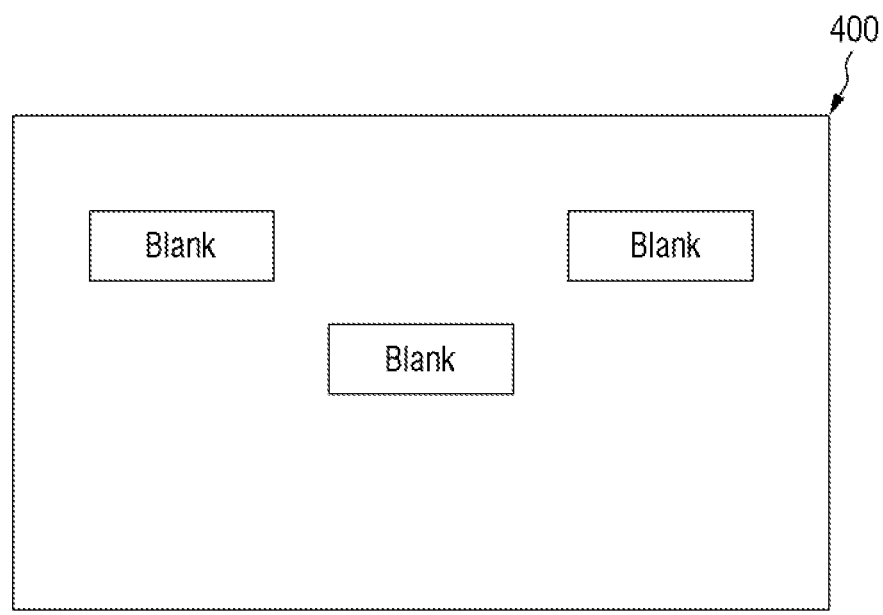
Figure 11C:
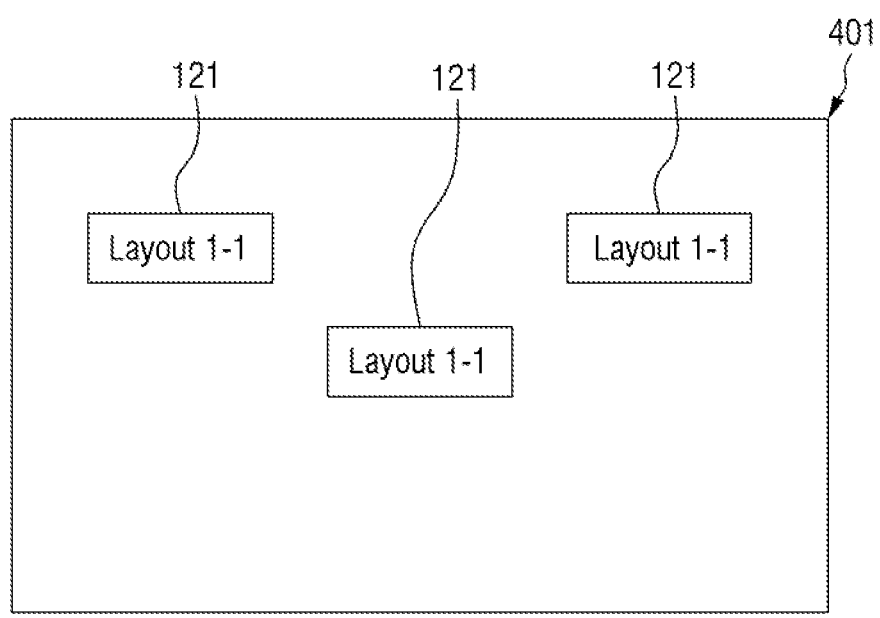
Figure 12:
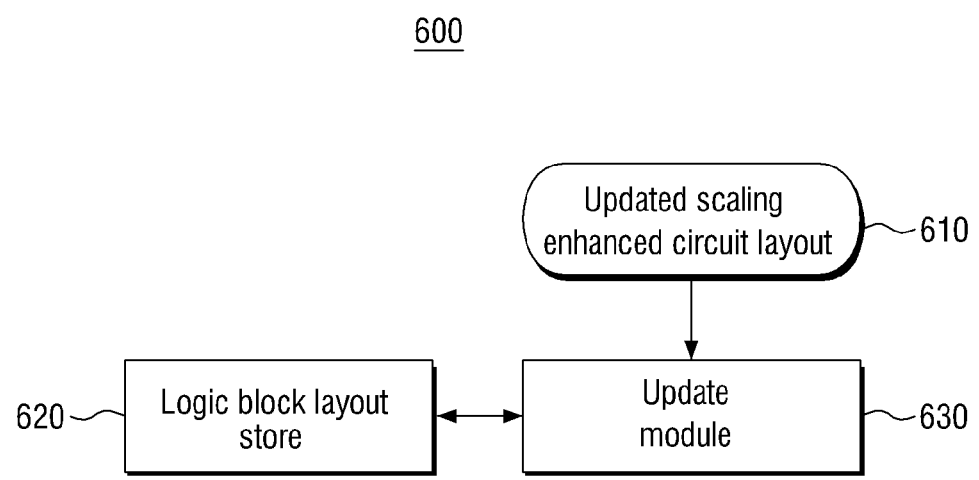
FIG. 12 is a block diagram explaining a system for designing an integrated circuit, which executes S220 of FIG. 10.

FIG. 10 is a flowchart explaining a method for designing an integrated circuit according to another embodiment of the present invention, and FIGS. 11A to 11C are diagrams explaining S220 of FIG. 10. FIG. 12 is a block diagram explaining a system for designing an integrated circuit, which executes S220 of FIG. 10.

Referring to FIGS. 1 to 9, the standard cell layouts 300, 310, 320, and 330 are designed using the first scaling enhanced circuit layout 120 and the design rule (S200). At least one of the standard cell layouts 300, 310, 320, and 330 includes the first scaling enhanced circuit layout 120.

The first scaling enhanced circuit layout 120 may include the marker layer 115 (in FIG. 4B).

Since designing of the standard cell layouts 300, 310, 320, and 330 is substantially the same as the designing as described above with reference to FIGS. 1 to 6, the explanation thereof will be omitted.

Then, the logic block layout 400 that includes the standard cell layouts 300, 310, 320, and 330 is designed (S210).

Referring to FIGS. 10 and 11A to 11C, the first scaling enhanced circuit layout 120 in the logic block layout 400 is replaced by an updated first scaling enhanced circuit layout 121. Through this, the logic block layout 400 is updated (S220).

First, in a similar manner to that as described above with reference to FIGS. 2 to 4A and 4B, the updated first scaling enhanced circuit layout 121 is designed through updating of the first scaling enhanced circuit layout 120. When the manufacturing process that is used to optimize the first scaling enhanced circuit layout 120 is changed, the first scaling enhanced circuit layout 120 is updated to reflect the changed layout and/or manufacturing process and the like.

The updated first scaling enhanced circuit layout 121 corresponds to the same design rule violation requisite region 105 as the first scaling enhanced circuit layout 120.

The golden scaling enhanced layout 110 may be updated using the updated first scaling enhanced circuit layout 121.

Then, the first scaling enhanced circuit layout 120 included in the logic block layout 400 is removed as shown in FIGS. 11A and 11B. A portion of the logic block layout 400, from which the first scaling enhanced circuit layout 120 is removed, may be blank.

In the logic block layout 400, the place where the first scaling enhanced circuit layout 120 is positioned can be confirmed using the marker layer included in the first scaling enhanced circuit layout 120.

Then, the updated first scaling enhanced circuit layout 121 is arranged in the blank portion from which the first scaling enhanced circuit layout 120 is removed as shown in FIGS. 11B and 11C.

Through this, the updated logic block layout 401 is designed.

The logic block layout can be re-designed through a simple process of updating the scaling enhanced circuit layout according to the change of the manufacturing process and replacing the existing scaling enhanced circuit layout by the updated scaling enhanced circuit layout.

If the scaling enhanced layout in the form of graphic data is not used, a lot of time is required to update the logic block layout. That is, a design rule manual is updated, and a process design kit (PDK) is updated. Then, the standard cell layouts are updated using the updated process design kit, and then the logic block layout is updated using the updated standard cell layouts.

The logic block layout is updated through a series of complicated procedures. However, using the method for designing the integrated circuit as described herein, the logic block layout can be updated through simple replacement of the scaling enhanced layout.

Referring to FIGS. 11A to 11C and 12, a system 600 for designing an integrated circuit that updates the logic block layout 400 may include a second input module 610, a second storage 620, and an update module 630.

The second input module 610 may receive an input of the updated first scaling enhanced circuit layout 121 that is generated through updating of the first scaling enhanced circuit layout 120. The second input module 610 may receive the input in the form of graphic data.

The second storage 620 may be a portion where the logic block layout 400 that includes the first scaling enhanced circuit layout 120 is stored. However, this is only for convenience in explanation, but the present invention is not limited thereto. That is, a separate input module that receives the input of the logic block layout 400 that includes the first scaling enhanced circuit layout 120 may be additionally provided.

The update module 630 may search for and remove the first scaling enhanced circuit layout 120 from the logic block layout 400, and may arrange the updated first scaling enhanced circuit layout 121 in the position from which the first scaling enhanced circuit layout 120 is removed.

The update module 630 can read out what position in the logic block layout 400 the first scaling enhanced circuit layout 120 is arranged in through confirming of the marker layer included in the first scaling enhanced circuit layout 120.

Further, the update module 630 may send the updated logic block layout 401 to the second storage 620 so that the updated logic block layout 401 is stored in the second storage 620, but is not limited thereto. That is, the update module 630 may send the updated logic block layout 401 to a separate storage module or an output unit, or may store the updated logic block layout 401 therein.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method of manufacturing an integrated circuit, comprising:
   providing a data file that includes a scaling enhanced circuit layout; and
   providing a first standard cell layout using a plurality of design rules and the data file,
   wherein the scaling enhanced circuit layout includes a design rule violation layer that violates at least one of the plurality of design rules, and
   wherein the first standard cell layout includes:
      a first layout region of the first standard cell layout corresponding to the data file and including the design rule violation layer, and
      a second layout region of the first standard cell layout using the plurality of design rules;
   creating a layout of the integrated circuit, the layout of the integrated circuit comprising the first standard cell layout including the first layout region that includes design elements that violate at least one of the plurality of design rules, and the second layout region,
   creating a plurality of photolithographic masks using the layout of the integrated circuit; and
   creating the integrated circuit using the plurality of photolithographic masks,
   wherein creating the layout of the integrated circuit comprises using a netlist and a standard cell library including the first standard cell layout, the netlist comprising a plurality of instances, their functions and interconnections between the instances.

2. The method of claim 1, further comprising checking the design rules of the first standard cell layout using a design rule checker,
   wherein the checking the design rules of the first standard cell layout includes processing first layout region as if the first layout region satisfies the design rules by skipping the checking the first layout region of the first standard cell layout or ignoring any design rule violations of the first layout region of the first standard cell layout.

3. The method of claim 1, wherein the scaling enhanced circuit layout includes a marker layer.

4. The method of claim 1, further comprising arranging the scaling enhanced circuit layout in the first layout region of the first standard cell layout.

5. The method of claim 4, wherein the data file provides a fixed size of elements of the first layout region.

6. The method of claim 1, further comprising providing a second standard cell layout that is different from the first standard cell layout, wherein the second standard cell layout includes:
   a first layout region of the second standard cell layout corresponding to the data file; and
   a second layout region of the second standard cell layout conforming to the plurality of design rules.

7. The method of claim 6, wherein the first layout region of the first standard cell layout and the first layout region of the second standard cell layout comprise the same layout.

8. The method of claim 1, further comprising designing a logic block layout that includes the first standard cell layout,
   wherein the first standard cell layout includes the scaling enhanced circuit layout, and
   the scaling enhanced circuit layout is arranged in a partial region of the logic block layout.

9. The method of claim 8, further comprising:
   defining a design rule violation requisite region in a part of a standard cell;
   designing the design rule violation layer through optimization of a process of manufacturing the design rule violation requisite region; and
   designing the scaling enhanced circuit layout that includes the design rule violation layer.

10. The method of claim 9, further comprising:
    designating the scaling enhanced circuit layout as a golden scaling enhanced layout; and
    checking whether the scaling enhanced circuit layout included in the logic block layout is changed in a process of designing the first standard cell layout using the golden scaling enhanced layout.

11. The method of claim 9, wherein the data file graphically represents the scaling enhanced circuit layout.

12. The method of claim 1, wherein the second layout region of the first standard cell layout is positioned in the vicinity of the first layout region of the first standard cell layout.

13. The method of claim 1, wherein the data file is one of a GDS (Graphic Database System) file, a GDS instance file, and a hard macro file.

14. A method for manufacturing an integrated circuit, comprising:
providing a first standard cell layout including a first layout region and a second layout region, the first layout region comprising a first scaling enhanced circuit layout and a marker layer identifying the location of the first scaling enhanced circuit layout;
then, designing a logic block layout that includes a plurality of standard cell layouts including the first standard cell layout;
then, updating the logic block layout through replacement of the first scaling enhanced circuit layout in the logic block layout by a second scaling enhanced circuit layout;
then, creating a plurality of photolithographic masks using the logic block layout that includes the first standard cell layout including the first layout region that includes the second scaling enhanced circuit layout and the second layout region; and
then, creating the integrated circuit using the plurality of photolithographic masks,
wherein designing the logic block layout comprises using a netlist and a standard cell library including the first standard cell layout, the netlist comprising a plurality of instances, their functions and interconnections between the instances, and
wherein the second scaling enhanced circuit layout violates a design rule.

15. The method for manufacturing an integrated circuit of claim 14,
wherein the second layout region of the first standard cell layout conforms to the design rule.

16. The method for manufacturing an integrated circuit of claim 15, wherein the first scaling enhanced circuit layout is provided in the form of a GDS (Graphic Database System) file, a GDS instance file, or a hard macro file.

17. The method for manufacturing an integrated circuit of claim 14, wherein the updating the logic block layout includes removing the first scaling enhanced circuit layout from a first position included in the logic block layout, and arranging the second scaling enhanced circuit layout in the first position.

18. The method for manufacturing an integrated circuit of claim 14, wherein updating the logic block layout includes confirming a position of the first scaling enhanced circuit layout using the marker layer.

19. The method of claim 1,
wherein the second layout region of the first standard cell layout of the standard cell library is variable and restricted to conforming to the plurality of design rules, and
wherein creating the integrated circuit comprises patterning layers formed on a substrate using the plurality of photolithographic masks.

20. The method of claim 19, wherein the first standard cell layout comprises a first definition of the first layout region that is fixed and comprises a second definition of the second layout region that is variable.

* * * * *